United States Patent
Enkisch

(10) Patent No.: US 10,061,204 B2
(45) Date of Patent: Aug. 28, 2018

(54) MIRROR, IN PARTICULAR FOR A MICROLITHOGRAPHIC PROJECTION EXPOSURE APPARATUS

(71) Applicant: Carl Zeiss SMT GmbH, Oberkochen (DE)

(72) Inventor: Hartmut Enkisch, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 15/264,054

(22) Filed: Sep. 13, 2016

(65) Prior Publication Data

US 2016/0377984 A1    Dec. 29, 2016

Related U.S. Application Data

(63) Continuation of application No. PCT/EP2015/053471, filed on Feb. 19, 2015.

(30) Foreign Application Priority Data

Mar. 13, 2014   (DE) ................ 10 2014 204 660

(51) Int. Cl.
  *G03B 27/42*    (2006.01)
  *G03F 7/20*     (2006.01)
  (Continued)

(52) U.S. Cl.
  CPC ......... *G03F 7/702* (2013.01); *G02B 17/0663* (2013.01); *G03F 7/70316* (2013.01); *G03F 7/70958* (2013.01); *G21K 1/062* (2013.01)

(58) Field of Classification Search
  CPC .. G03F 7/702; G03F 7/70033; G03F 7/70075; G03F 7/70316; G03F 7/70958;
  (Continued)

(56) References Cited

U.S. PATENT DOCUMENTS 7,235,801 B2    6/2007 Bakker et al.
2005/0279951 A1  12/2005 Bakker
(Continued)

FOREIGN PATENT DOCUMENTS

DE    102011075579 A1    11/2012
DE    102012202675 A1    1/2013
(Continued)

OTHER PUBLICATIONS

English language translation of International Search Report and Written Opinion in counterpart International Application No. PCT/EP2015/053471, dated Aug. 19, 2015.
(Continued)

*Primary Examiner* — Mesfin Asfaw
(74) *Attorney, Agent, or Firm* — Edell, Shapiro & Finnan, LLC

(57) ABSTRACT

A mirror, in particular for a microlithographic projection exposure apparatus has an optically effective surface, wherein the mirror has a reflectivity of at least 0.5 for electromagnetic radiation which has a prescribed working wavelength and impinges on the optically effective surface at an angle of incidence based on the respective surface normal of at least 65°, wherein the mirror has at least one layer (160, 170, 320) which comprises a compound of an element of the second period and an element of the 4d transition group, wherein the mirror has a protective layer (430, 530, 630, 730) arranged on top in the direction of the optically effective surface, wherein the material of the layer (420, 510, 620, 705) arranged in each case underneath the protective layer in the direction of the optically effective surface has a lower absorption than the material of the protective layer (430, 530, 630, 730).

11 Claims, 11 Drawing Sheets

(51) Int. Cl.
*G02B 17/06* (2006.01)
*G21K 1/06* (2006.01)

(58) Field of Classification Search
CPC ..... G03F 1/52; G03F 7/20; G03F 1/48; G03F 2007/2067; G03F 7/70; G03F 7/70025; G03F 7/70058; G03F 7/70133; G03F 7/70141; G02B 5/0891; G02B 19/0095; G02B 5/09; G02B 26/0833
See application file for complete search history.

(56) References Cited

U.S. PATENT DOCUMENTS

| | | | |
|---|---|---|---|
| 2011/0149262 A1 | 6/2011 | Van Herpen et al. | |
| 2014/0022525 A1* | 1/2014 | Enkisch ............. | G02B 17/0663 355/67 |

FOREIGN PATENT DOCUMENTS

| | | |
|---|---|---|
| EP | 1150139 A2 | 10/2001 |
| WO | 2012126867 A1 | 9/2012 |

OTHER PUBLICATIONS

Braic, M. et al., "Grazing incidence mirrors for EUV lithography", 2008 International Semiconductor Conference, Feb. 2010, p. 177-200.
Office Action in corresponding German Application 102014204660. 2, dated Oct. 16, 2014, along with English Translation.
International Preliminary Report on Patentability and Written Opinion in counterpart International Application No. PCT/EP2015/053471, dated Sep. 22, 2016, 12 pages.

\* cited by examiner

MIRROR, IN PARTICULAR FOR A MICROLITHOGRAPHIC PROJECTION EXPOSURE APPARATUS

CROSS REFERENCE TO RELATED APPLICATIONS

This is a Continuation of International Application PCT/EP2015/053471, which has an international filing date of Feb. 19, 2015, and the disclosure of which is incorporated in its entirety into the present Continuation by reference. The following disclosure is also based on and claims the benefit of and priority under 35 U.S.C. § 119(a) to German Patent Application No. DE 10 2014 204 660.2, filed Mar. 13, 2014, which is also incorporated in its entirety into the present Continuation by reference.

FIELD OF THE INVENTION

The invention relates to a mirror, in particular for a microlithographic projection exposure apparatus.

BACKGROUND

Microlithography is used for producing microstructured components, for example integrated circuits or LCDs. The microlithographic process is carried out in a projection exposure apparatus which has an illumination device and a projection lens. The image of a mask (=reticle) illuminated by the illumination device is projected here by the projection lens onto a substrate (e.g. a silicon wafer) which is coated with a light-sensitive layer (photoresist) and is arranged in the image plane of the projection lens in order to transfer the mask structure onto the light-sensitive coating of the substrate.

In projection lenses designed for the EUV range, i.e. at wavelengths of, for example, about 13 nm or about 7 nm, mirrors are used as optical components for the imaging process because of the lack of availability of suitable transparent refractive materials.

The operation of, inter alia, mirrors under grazing incidence is known. Here and in the following, mirrors which are operated under grazing incidence and whose use is fundamentally desirable because of the comparatively high reflectivities which can be achieved (for example 80% and more) are mirrors for which the reflection angles based on the respective surface normal which are obtained in the reflection of EUV radiation are at least 65°. Such mirrors are sometimes also referred to as GI mirrors ("grazing incidence").

To optimize the performance of a projection exposure apparatus, it is not only necessary to make a suitable choice of the respective mirrors or layer materials with a view to desirable optical properties, but also to take account of the fact that impairment of these optical properties (in particular in the form of reflection losses or undesirable changes in the reflection behavior as a function of the angle of incidence) can occur as a result of contamination during operation of the projection exposure apparatus.

With regard to the prior art, reference will be made, merely by way of example, to US 2005/0279951 A1.

SUMMARY

In the light of the above background, it is an object of the present invention to provide a mirror, in particular for a microlithographic projection exposure apparatus, which during operation of the optical system concerned or the projection exposure apparatus makes it possible to achieve high reflectivities or low light losses together with low susceptibility to contamination.

This object is achieved by the features of the independent claims.

According to one aspect of the invention, a mirror, in particular for a microlithographic projection exposure apparatus, has an optically effective surface, wherein the mirror has a reflectivity of at least 0.5 for electromagnetic radiation which has a prescribed working wavelength and impinges on the optically effective surface at an angle of incidence based on the respective surface normal of at least 65°;

wherein the mirror has at least one layer which comprises a compound of an element of the second period and an element of the 4d transition group;

wherein the mirror has a protective layer arranged on top in the direction of the optically effective surface;

wherein the material of the layer arranged in each case underneath the protective layer in the direction of the optically effective surface has a lower absorption than the material of the protective layer.

The invention is based, in particular, on the concept of achieving the combination of a protective action or attainment of at least substantial chemical resistance to the contamination occurring during operation of the optical system with advantageous optical properties of the mirror by an element of the second period, e.g. beryllium (Be), boron (B), carbon (C), nitrogen (N) or oxygen (O), being combined with an element of the 4d transition group, e.g. molybdenum (Mo), niobium (Nb) or zirconium (Zr), in a layer of the mirror.

The invention proceeds, in particular, from the idea that molybdenum (Mo), for example, appears, in terms of the desirable advantageous optical properties in respect of comparatively low absorption and also the relatively low refractive index, which, particularly in the case of grazing incidence of electromagnetic EUV radiation, lead to a higher reflectivity compared to all other elements, fundamentally to be a particularly preferred material from the point of view of optical properties but, owing to the susceptibility to oxidation, has an unacceptably high susceptibility to contamination when used as such (i.e. in elemental form).

Proceeding from this idea, the present invention combines molybdenum (Mo) or another suitable element of the 4d transition group with an element of the second period (in particular boron (B), carbon (C) or nitrogen (N)) with the consequence that the risk of oxidation is avoided and as a result a layer which is at the same time chemically resistant and has optical properties which are, for example, equal or even superior to those of the pure elements molybdenum (Mo) or ruthenium (Ru) is achieved.

According to one embodiment, the mirror has exclusively this (combining an element of the second period and an element of the 4d transition group) layer and a substrate (on which the layer is formed or arranged).

In further embodiments, the layer combining an element of the second period and an element of the 4d transition group can be arranged as second layer on a first layer composed of ruthenium (Ru).

According to a further aspect, the invention also provides a mirror, in particular for a microlithographic projection exposure apparatus, having an optically effective surface, wherein the mirror has a reflectivity of at least 0.5 for electromagnetic radiation which has a prescribed working wavelength and impinges on the optically effective surface at an angle of incidence based on the respective surface normal of at least 65°, and wherein the mirror has a first layer composed of a first material comprising ruthenium (Ru), rhodium (Rh) or palladium (Pd) and a second layer which is arranged on top of this first layer in the direction of the optically effective surface and consists of a second material which has a lower absorption compared to the first material.

According to this further aspect, in the construction of a mirror according to the invention, there is a "task division" between the layers present in the mirror insofar as the (ruthenium-, rhodium- or palladium-comprising) first layer serves as "base layer" having comparatively advantageous optical constants and serves to set the limiting angle of the total reflection (at which the reflectivity curve has its first inflection), while the second layer (which has a lower absorption than the material of the first layer) serves as "amplifier layer" which increases the reflectivity in the case of grazing incidence. This configuration makes it possible to achieve a targeted increase in the reflectivity in the angle range relevant in the present case (i.e. under grazing incidence) or at an angle of incidence based on the respective surface normal of at least 65°, with a "premature kinking" of the reflectivity curve (which describes the reflectivity as a function of the angle of incidence) being able to be avoided at the same time.

In an embodiment, the material of the second layer comprises molybdenum (Mo) or a compound of an element of the second period and an element of the 4d transition group.

In an embodiment, the element of the 4d transition group is selected from the group consisting of molybdenum (Mo), niobium (Nb) and zirconium (Zr).

In an embodiment, the element of the second period is selected from the group consisting of beryllium (Be), boron (B), carbon (C), nitrogen (N) and oxygen (O).

In an embodiment, the mirror additionally has a protective layer arranged on top in the direction of the optically effective surface.

As a result of the mirror having such an additional protective layer, a further "task division" or functional separation in respect of the individual layers present can be achieved in the layer structure of the mirror of the invention. In particular, the protective layer concerned can be composed of a material which is very "chemically stable" or has the desired chemical resistance against contamination occurring during operation of the optical system but has comparatively poorer optical properties, with the latter circumstance being able to be allowed for by only a very low thickness (for example 2-3 nm) of the protective layer.

In other words, the protective layer is preferably configured in such a way that it is just sufficiently thick to provide the desired chemical resistance, with the optimization of the optical properties or the increase in the reflectivity of the mirror being able to be achieved by the first and/or second layer located, based on the optically effective surface, below the protective layer (i.e. the above-described base layer and/or amplifier layer). At the same time, the thickness of the base layer and/or amplifier layer concerned can in each case be selected with a view to the desired optimization of the optical properties without account having to be taken of the chemical resistance (which is ensured by the abovementioned protective layer).

Owing to the protective action against contamination occurring during operation of the optical system which is provided by the protective layer, significantly greater freedom with regard to the selection of material in the layer underneath (base layer and/or amplifier layer) is also achieved since the latter layers can also be made of comparatively reactive materials because of the protective layer on top of them.

In an embodiment, the material of the layer which in each case is located underneath the protective layer in the direction of the optically effective surface has a lower absorption than the material of the protective layer.

In an embodiment, the protective layer comprises silicon nitride ($Si_3N_4$), silicon carbide (SiC) or a compound with an element of the 3d transition group (Sc, Ti, V, . . . ), 4d transition group (Y, Zr, Nb, . . . ) or the lanthanides (La, Ce, Pr, Nd, . . . ).

In an embodiment, the protective layer has a thickness of not more than 5 nm.

In an embodiment, the second layer and the protective layer each have such a thickness profile that the mirror differs in respect of the dependence of the reflectivity on the angle of incidence by not more than 2%, in particular not more than 1%, more particularly not more than 0.5%, from a mirror which has only the identically configured first layer but not the second layer and the protective layer. Here, the thickness profile of the layer concerned can be a constant thickness or a thickness which varies locally.

According to this further aspect of the invention, the respective thickness profiles of the second layer and the protective layer in the above-described layer structure made up of first layer, second layer and protective layer can be selected so that there is no change (or only a comparatively small or negligible change) in the reflectivity profile (i.e. in the dependence of the reflectivity on the angle of incidence) compared to a mirror which has only the first layer ("base layer").

In other words, the layer thicknesses in the layer structure according to the invention made up of first layer, second layer and protective layer are selected so that a particular profile of the dependence of the reflectivity on the angle of incidence is exactly achieved. In particular, the layer structure can, for example, be configured in respect of the respective thicknesses of first layer, second layer and protective layer in such a way that the maximum reflectivity of the mirror is not achieved but instead, accepting some decreases in the reflectivity, a particular desired reflectivity profile (e.g. the reflectivity profile of a "pure ruthenium mirror" without the second layer and without the protective layer) is set. As a consequence, for example, the necessity of adapting the optical design to the use of a mirror having the layer structure according to the invention can be avoided. In particular, a decrease in the reflectivity brought about by the protective layer can be at least partly compensated for by the second layer.

In an embodiment, the mirror has at least one barrier layer. For example, such a barrier layer can be arranged between the first layer and the second layer and/or directly underneath any protective layer present. Such a barrier layer can, for example, serve as diffusion barrier to avoid undesirable diffusion between the first layer and the second layer or to prevent diffusion of, for example, any oxygen present in the protective layer into the underlying layer or the underlying layers. Such a barrier layer can, merely by way of example, have a thickness in the region of a few nanometers (nm) or less.

According to a further aspect, the invention relates to a mirror, in particular for a microlithographic projection exposure apparatus, having an optically effective surface, wherein the mirror has a reflectivity of at least 0.5 for electromagnetic radiation which has a prescribed working wavelength and impinges on the optically effective surface at an angle of incidence based on the respective surface normal of at least 65°, wherein the mirror has at least one layer which comprises a compound of an element of the second period and an element of the 4d transition group, and wherein the mirror has either exclusively this layer or exclusively this layer and a substrate.

In an embodiment, the element of the 4d transition group is selected from the group consisting of molybdenum (Mo), niobium (Nb) and zirconium (Zr).

In an embodiment, the element of the second period is selected from the group consisting of beryllium (Be), boron (B), carbon (C), nitrogen (N) and oxygen (O).

In an embodiment, the working wavelength is less than 30 nm, in particular can lie in the range from 10 nm to 15 nm.

The invention further provides a microlithographic projection exposure apparatus having an illumination device and a projection lens, wherein the illumination device illuminates a mask present in an object plane of the projection lens during operation of the projection exposure apparatus and the projection lens projects structures on this mask onto a light-sensitive layer present in an image plane of the projection lens, and the projection exposure apparatus has an optical system having the above-described features.

Further embodiments of the invention may be derived from the description and the dependent claims.

The invention is illustrated below with the aid of examples shown in the accompanying figures.

DETAILED DESCRIPTION

Figure 1A:
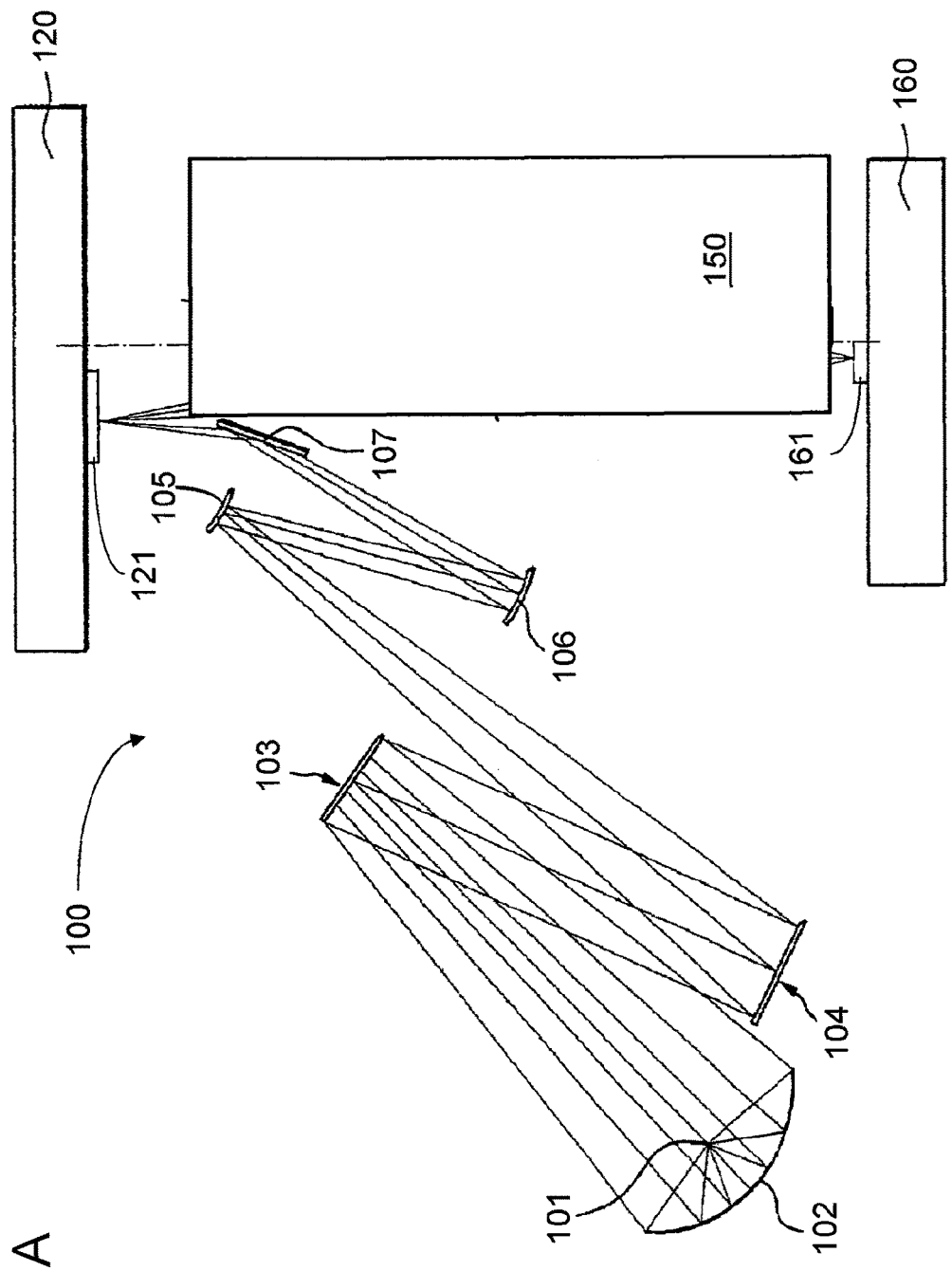
FIG. 1A schematically shows a projection exposure apparatus designed for operation in the EUV.

FIG. 1A schematically shows an illustrative projection exposure apparatus which is designed for operation in the EUV and in which the present invention can be implemented.

According to FIG. 1A, an illumination device in a projection exposure apparatus 100 designed for EUV has a field facet mirror 103 and a pupil facet mirror 104. The light of a light source unit comprising a plasma light source 101 and a collector mirror 102 is directed onto the field facet mirror 103. A first telescope mirror 105 and a second telescope mirror 106 are arranged in the light path after the pupil facet mirror 104. In the further light path, there is a deflection mirror 107 which is operated under grazing incidence and directs the radiation impinging on it onto an object field into the object plane of a projection lens which is merely indicated in FIG. 1A. A reflective structured mask 121 is arranged on a mask table 120 at the position of the object field and this mask is projected by the projection lens onto an image plane in which a substrate 161 coated with a light-sensitive layer (photoresist) is located on a wafer table 160.

Merely by way of example, the deflection mirror 107 operated under grazing incidence can have the structure according to the invention, hereinafter described with reference to FIG. 1B, FIG. 1C or FIG. 2A et seq.

The projection lens 150 can, for example, have a structure as is described in DE 10 2012 202 675 A1 (where this structure likewise has mirrors which are operated under grazing incidence and can be configured according to the invention) or a different structure.

In the following, possible embodiments of a mirror as per the present invention which is operated under grazing incidence are described with reference to the schematic depictions of FIGS. 1B-1C and FIGS. 2A-7.

Figure 1B:
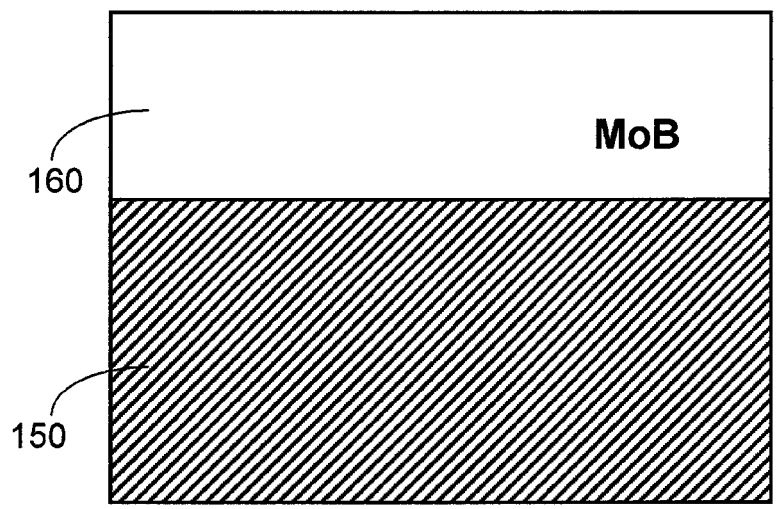
FIGS. 1B-1C schematically show the structure of a mirror in illustrative embodiments of the invention.

According to FIG. 1B, a mirror according to the invention has a layer 160 which in the specific example consists of molybdenum boride (MoB) and in the example has an illustrative thickness of 30 nm on a substrate 150 (made of any suitable material).

In further embodiments, the layer 160 can comprise a different chemical compound of an element of the second period (e.g. one of the elements lithium (Li), beryllium (Be), boron (B), carbon (C), nitrogen (N), oxygen (O) or fluorine (F)) with an element of the 4d transition group (e.g. one of the elements yttrium (Y), zirconium (Zr), niobium (Nb), molybdenum (Mo), technetium (Tc), ruthenium (Ru), rhodium (Rh) and palladium (Pd)).

Figure 1C:
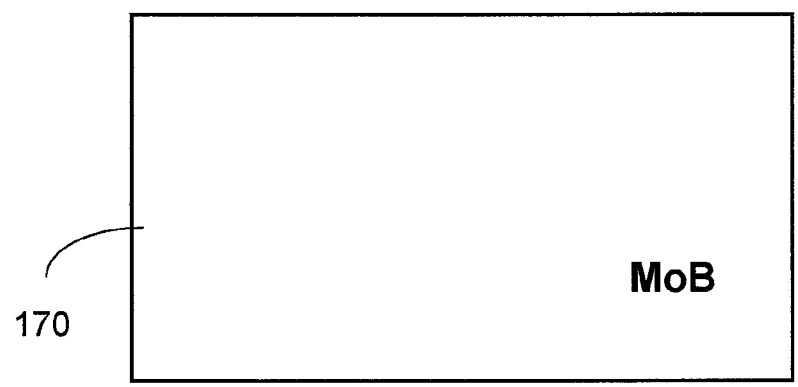

If the optically effective material concerned is available as bulk material, has suitable thermal properties and also can be shaped and polished in optical quality, it is possible to omit a further layer, in which case the mirror can, as schematically shown in FIG. 1C, also be made exclusively of a layer 170 comprising a material analogous to the layer 160 of FIG. 1a. In the latter case, the layer 170 which alone forms the mirror preferably has a thickness of at least 50 nm.

In the following, further embodiments of a mirror according to the invention, which have not only the layer described above with the aid of FIGS. 1B, 1C (optionally with an additional substrate) but in which a functional separation or task division is achieved by provision of a structure composed of a plurality of layers, are described with reference to the schematic depictions of FIGS. 2A-6.

Figure 2A:
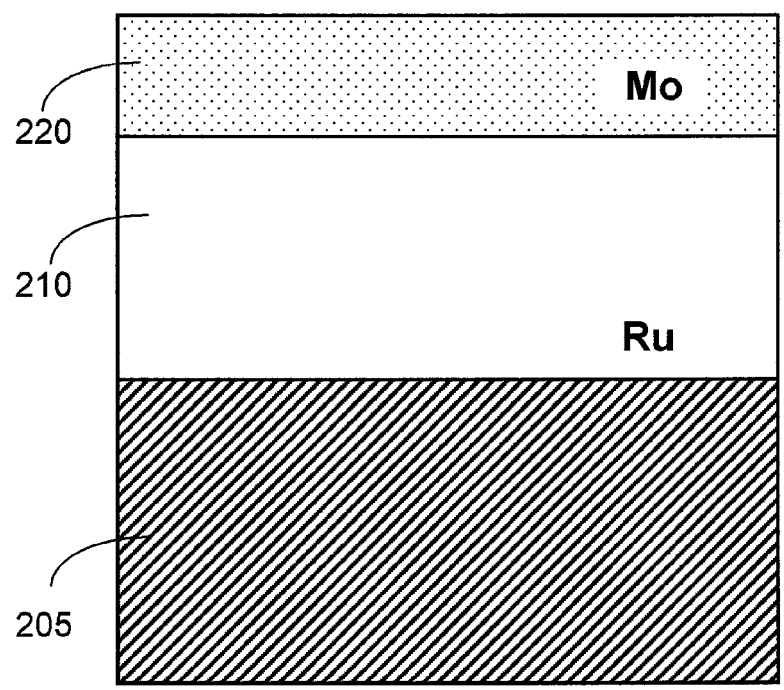
FIGS. 2A-7 schematically show the possible structure of a mirror in further embodiments of the invention.

In the example of FIG. 2A, a mirror according to the invention has a first layer 210 of ruthenium (Ru) and a second layer 220 of molybdenum (Mo) on a substrate 205 (which is once again made of any suitable material). Here, merely by way of example (and without the invention being restricted thereto), the first layer 210 has a thickness of 30 nm and the second layer 220 has a thickness of 9 nm.

The abovementioned task division in the case of the structure depicted in FIG. 2A is effected by the first layer 210 (as "base layer") providing a very advantageous limiting angle of the total reflection (in order to avoid premature "kinking" of the reflectivity curve in the reflectivity profile), while an amplification of the reflection in the relevant angle range (i.e. particularly for grazing incidence or at angles of incidence based on the respective surface normal of at least 65°) is achieved through the second layer 220 (which serves as "amplifier layer").

While the first layer 210 consists of pure ruthenium (Ru), the material of the second layer 220 can be, as alternatives, molybdenum (Mo) as per FIG. 2A or one of the materials mentioned above with reference to FIGS. 1B and 1C (i.e. a compound of an element of the second period and an element of the 4d transition group). Here, the material of the second layer should in each case have an absorption which is lower than that of ruthenium (Ru). Even though ruthenium (Ru) has in each case been selected as material of the first layer in the following examples, in further embodiments the first layer can also comprise rhodium (Rh) or palladium (Pd)

or a combination of ruthenium (Ru), rhodium (Rh) or palladium (Pd). In an analogous manner, the material of the second layer should in each case have an absorption which is lower than that of the material of the first layer.

Figure 2B:
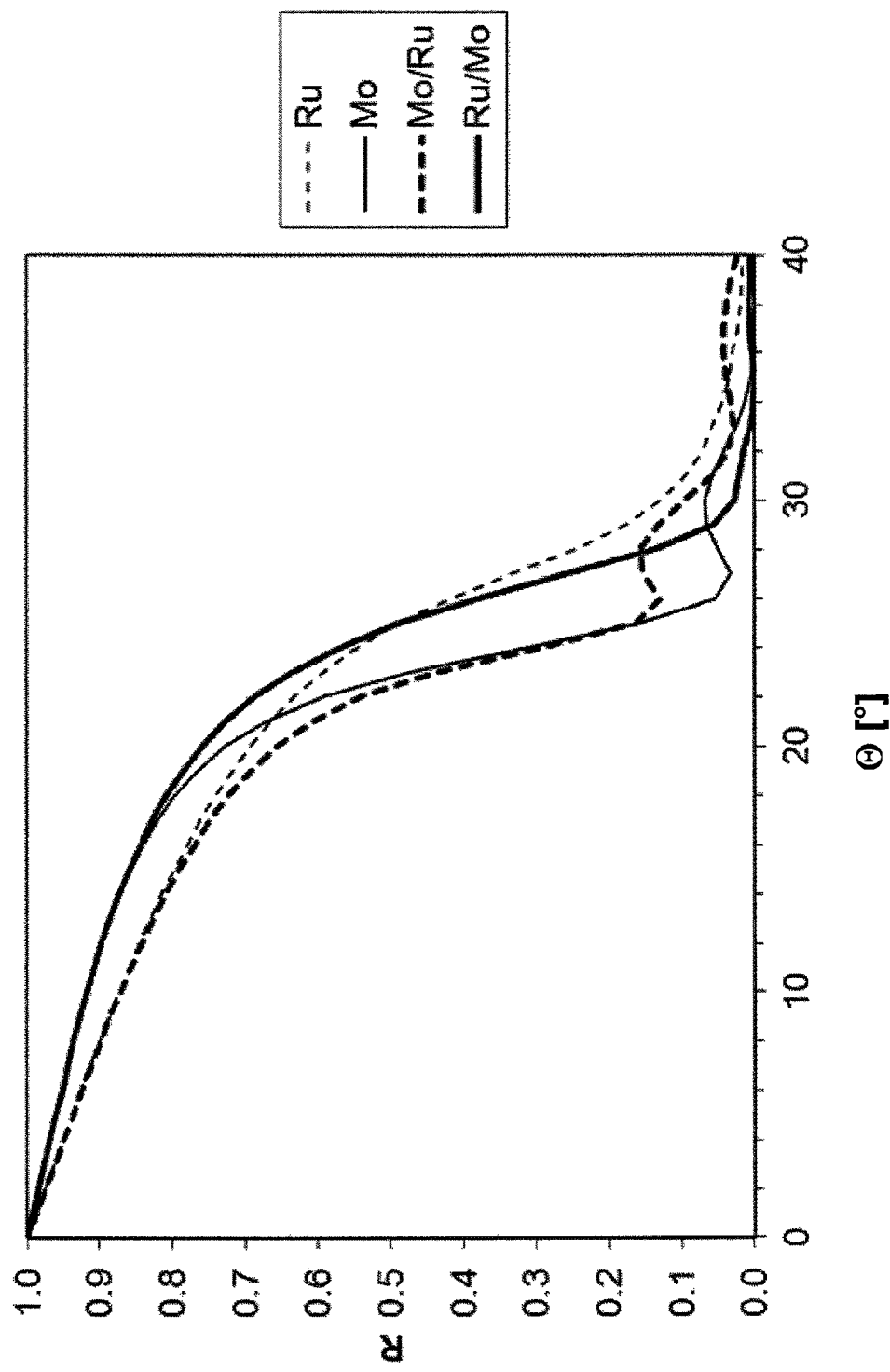

To illustrate the above-described effect, FIG. 2B shows the reflectivity profile as a function of the angle of the incident ray or the reflected ray relative to the reflecting surface both for the case of only one layer (composed of ruthenium (Ru) or molybdenum (Mo)) and for various layer sequences of molybdenum (Mo) and ruthenium (Ru) (where the material mentioned first in the legend is that of the base layer or first layer and the material mentioned last is that of the amplifier layer or second layer). As can be seen from FIG. 2B, a significant increase in the reflectivity in the relevant angle range combined with a significantly later "kinking" of the reflectivity curve can be achieved by selecting material according to the invention as per FIG. 2A.

Figure 3A:
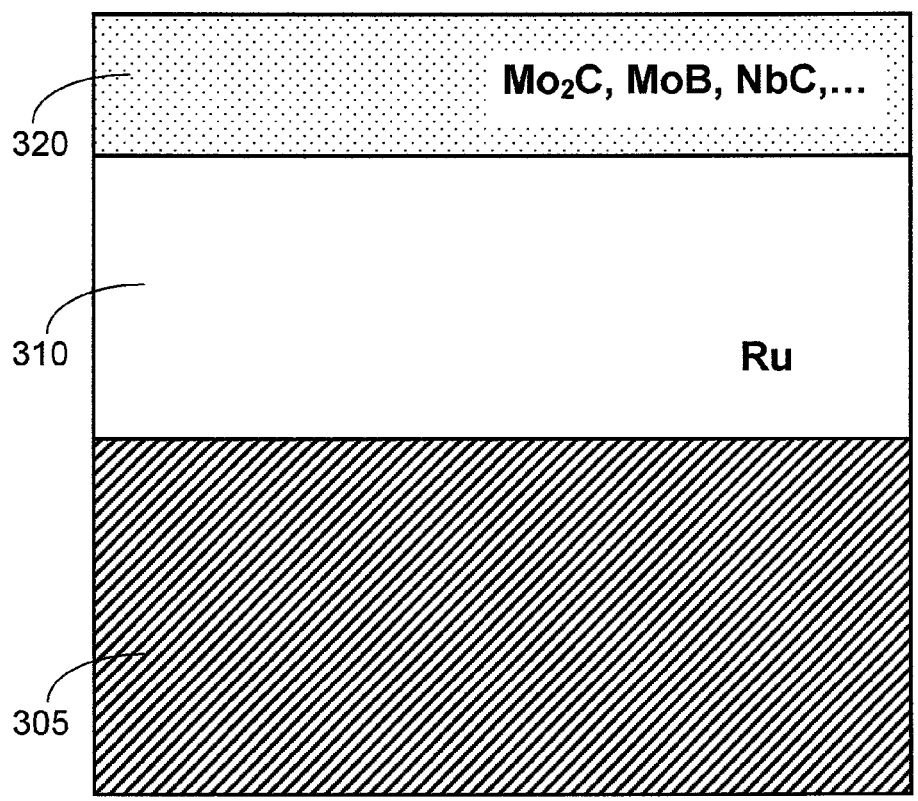
Figure 3B:
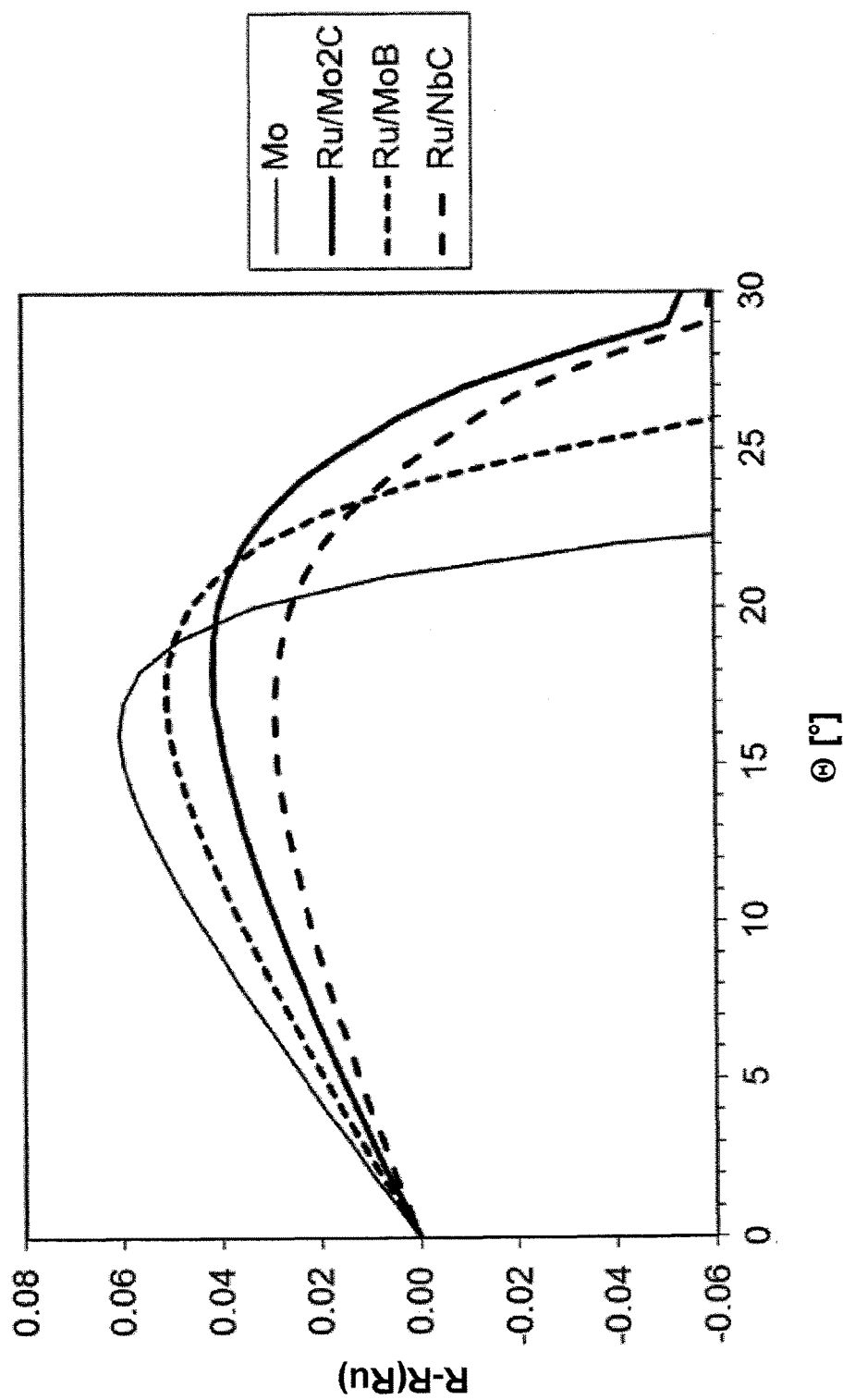

FIG. 3B serves to illustrate the reflectivity increase achieved with the structure according to the invention as per FIG. 3A; in FIG. 3B, the difference between the reflectivity achieved in each case and the reflectivity achieved in the case of a pure ruthenium (Ru) layer is plotted as a function of the angle of the incident ray or the reflected ray relative to the reflecting surface. In FIG. 3B, the respective layer thicknesses are 30 nm for ruthenium (Ru), 5 nm for molybdenum carbide ($Mo_2C$), 9 nm for molybdenum boride (MoB) and 5 nm for niobium carbide (NbC). In addition, the comparison of a single layer of molybdenum (Mo) having a thickness of 30 nm with the pure Ru layer having a thickness of 30 nm is shown as reference; likewise in the subsequent FIG. 4B and FIG. 5B.

Figure 4A:
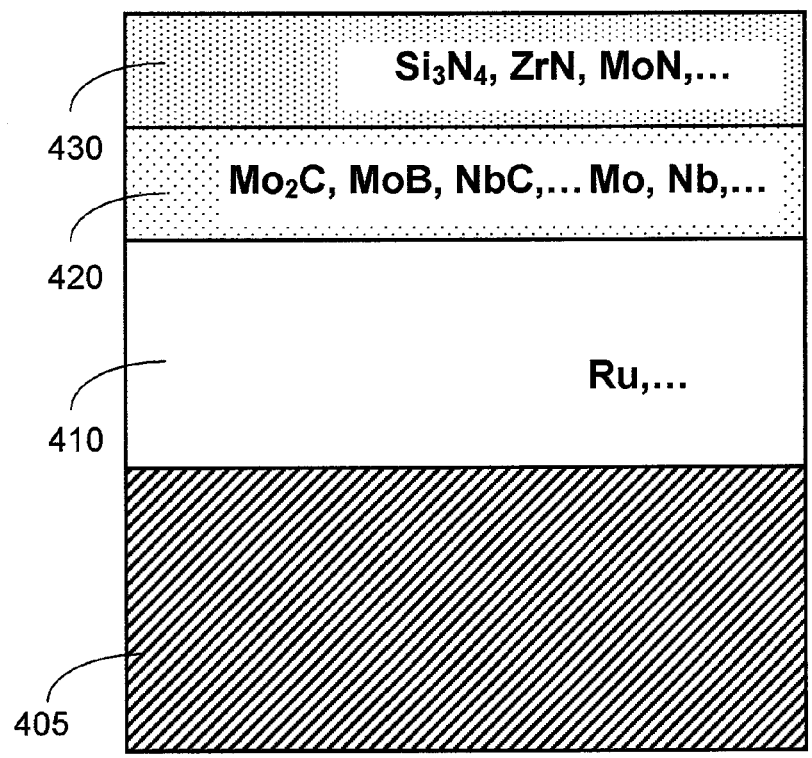

FIG. 4A serves to illustrate the structure of a mirror according to a further embodiment of the invention, with analogous components or components having essentially the same function compared to FIG. 3A being denoted by reference numerals increased by "100".

The mirror shown in FIG. 4A differs from the embodiment of FIG. 3A in that it has an additional protective layer 430 which is made of a material having a very high chemical stability; owing to the comparatively low thickness (for example 2-3 nm), relatively unfavourable optical properties can be accepted. Thus, the protective layer 430 can, merely by way of example, consist of silicon nitride ($Si_3N_4$).

In further possible embodiments, a material having comparatively more advantageous optical properties, in particular a material analogous to the embodiments of FIGS. 1B, 1C (i.e. a compound of an element of the second period and an element of the 4d transition group), can also be selected as material for the protective layer 430.

As regards the material of the second layer 420 (once again referred to as "amplifier layer" or layer serving to increase the reflectivity in the relevant angle range under grazing incidence in a manner analogous to FIG. 3A), comparatively more chemically reactive materials (e.g. pure niobium (Nb) or pure molybdenum (Mo)) can also be selected here in view of the protective action against contamination occurring during operation of the optical system provided by the protective layer 430.

Figure 4B:
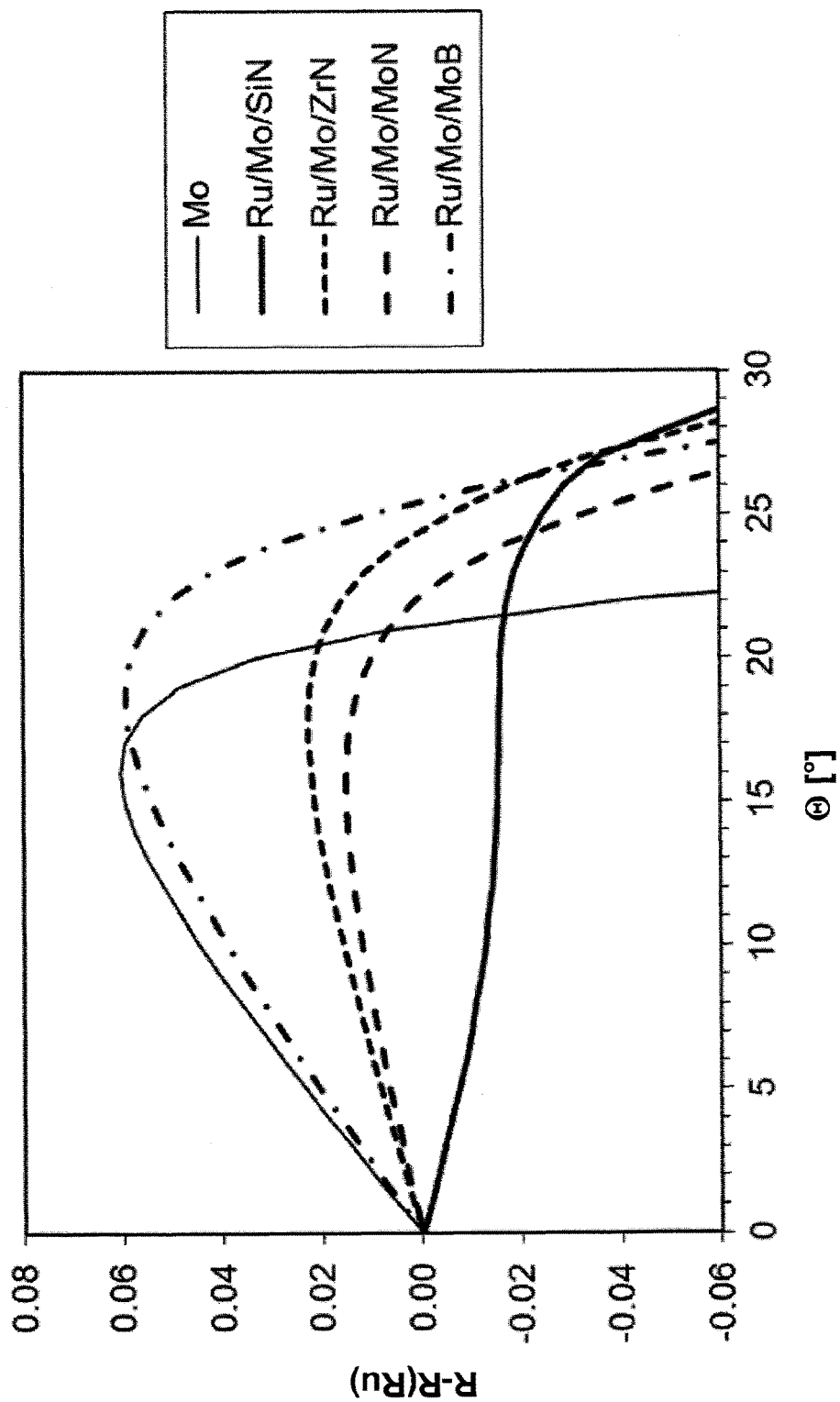

FIG. 4B serves to illustrate the increase in reflectivity achieved with the structure according to the invention as per FIG. 4A; in FIG. 4B, the difference between the reflectivity achieved in each case and the reflectivity achieved in the case of a pure ruthenium (Ru) layer is again plotted as a function of the angle of the incident ray or the reflected ray relative to the reflecting surface. In FIG. 4B, the respective layer thicknesses are 30 nm for ruthenium (Ru), 5 nm for molybdenum (Mo), 2 nm for silicon nitride ($Si_3N_4$), 2 nm for zirconium nitride (ZrN), 3 nm for molybdenum nitride (MoN) and 3 nm for molybdenum boride (MoB). Here, the 5 nm thick Mo layer is arranged between the first layer of Ru (alternatively Mo or Nb) having a thickness of 30 nm and the respective covering layer.

Figure 5A:
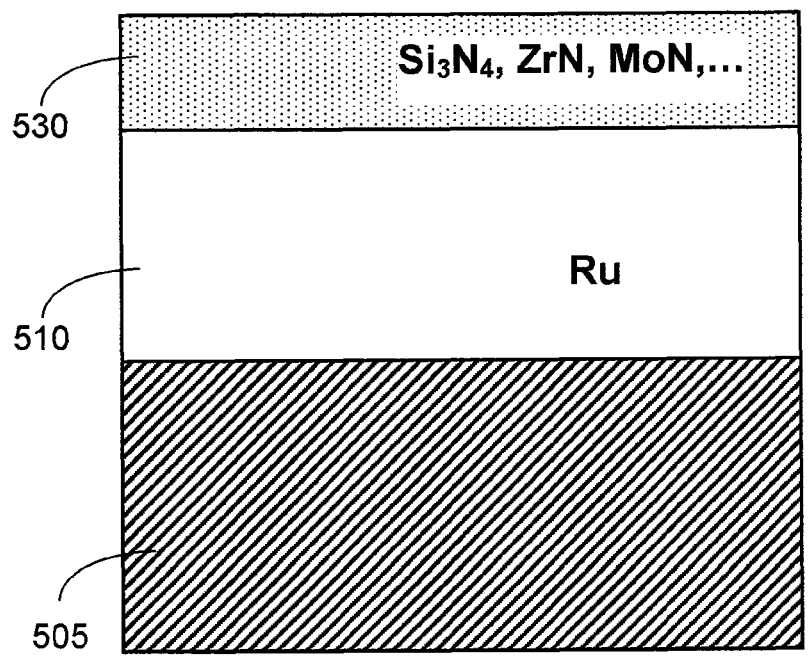

FIG. 5A serves to illustrate a further possible embodiment of a mirror according to the invention. This differs from the embodiment of FIG. 4A in that, in particular, the "amplifier layer" (second layer 420 in FIG. 4A) is omitted, so that the protective layer 530 is arranged directly on the first layer 510 (which serves as "base layer"). The embodiment of FIG. 5A is useful particularly when an additional amplifier layer can be dispensed with because of comparatively small values for the maximum angle of incidence or relatively undemanding requirements in respect of the reflectivity to be provided.

Figure 5B:
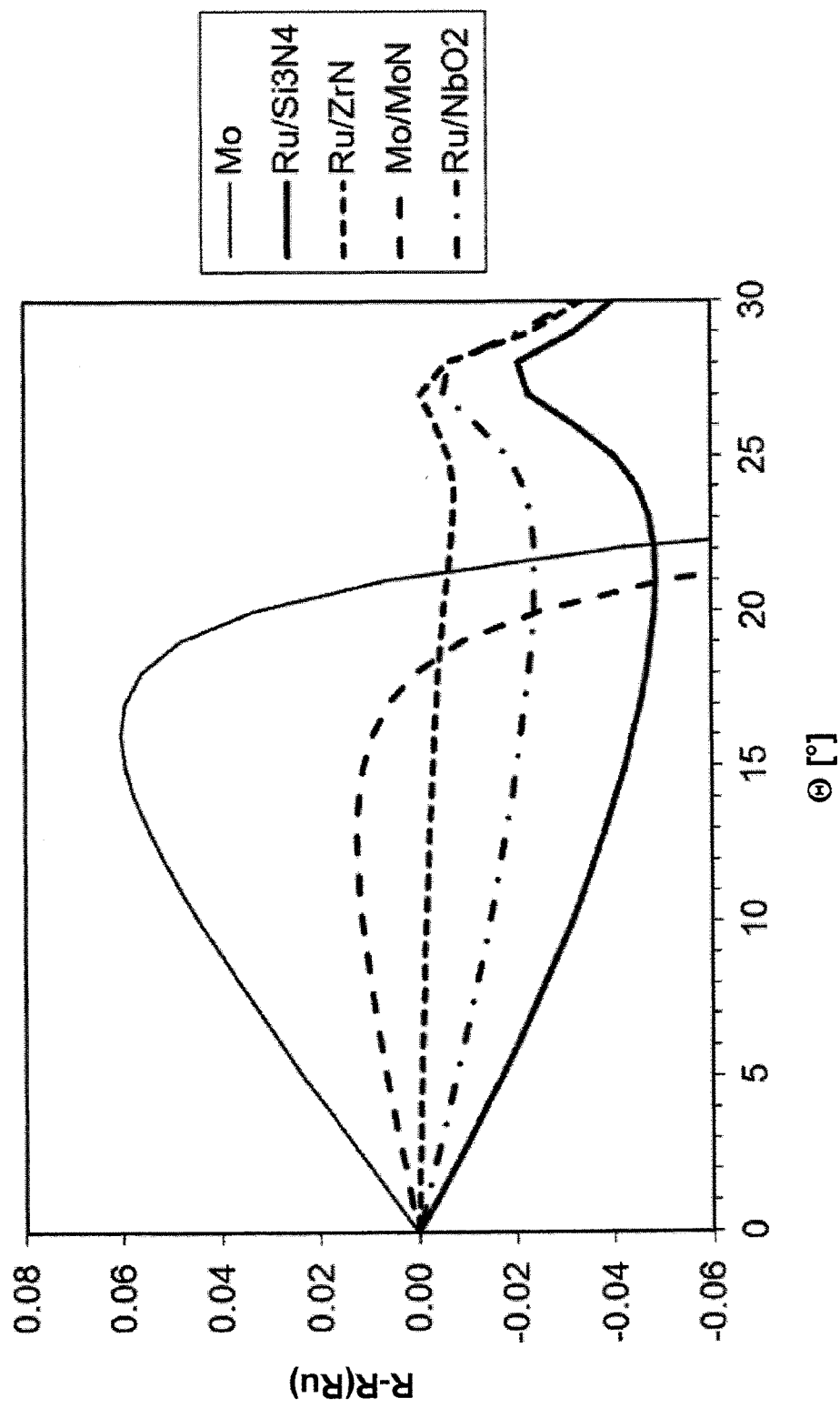

A plot analogous to the above reflectivity curves of FIGS. 3B and 4B of the reflection change achieved relative to the reflectivity of pure ruthenium (Ru) is depicted in FIG. 5B for the layer structure shown in FIG. 5A. Here, the respective thicknesses of the relevant layers are 30 nm for ruthenium (Ru), 2 nm for silicon nitride ($Si_3N_4$), 2 nm for zirconium nitride (ZrN), 30 nm for molybdenum (Mo), 3 nm for molybdenum nitride (MoN) and 1 nm for niobium oxide ($NbO_2$).

Figure 6:
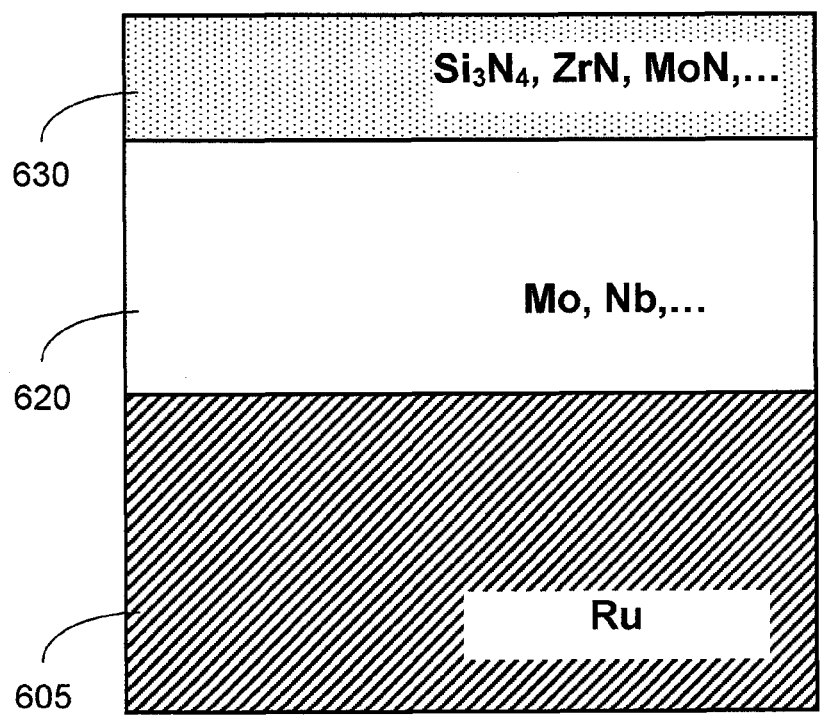

FIG. 6 shows a schematic depiction to illustrate a further possible embodiment of a mirror according to the invention; as a difference from the structure of FIG. 4A, the base layer (i.e. the first layer 410 in the mirror of FIG. 4A) has been omitted. According to FIG. 6, the layer 620 serving as "amplifier layer" is therefore arranged directly on the substrate 605, with the protective layer 630 again being arranged directly on the layer 620 serving as amplifier layer. Here, the substrate 605 itself serves as "base layer" in the abovementioned sense (i.e. to set a suitable limiting angle for the total reflection) and in the example is made of ruthenium (Ru).

Figure 7:
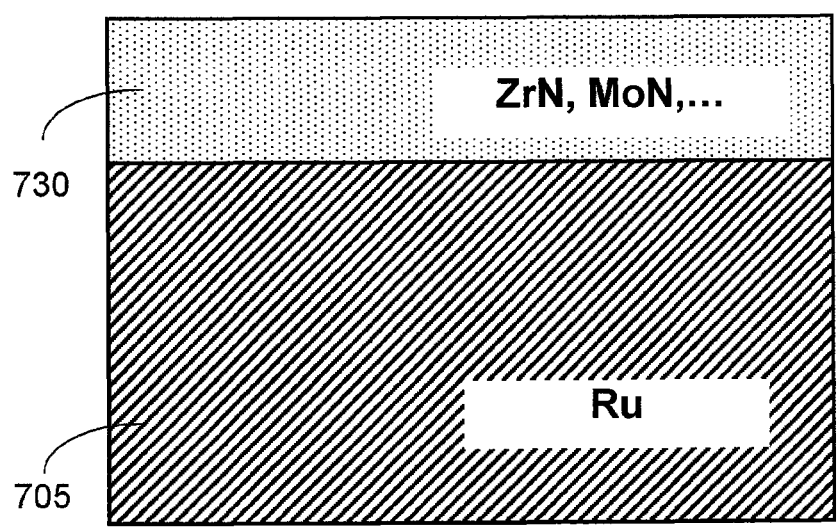

FIG. 7 shows a schematic depiction to illustrate a further possible structure of a mirror; here, a protective layer 730 is arranged directly on a substrate 705 (which once again serves as "base layer" in a manner analogous to FIG. 6). As material for the protective layer 730, it is possible to use, in particular, the materials mentioned with reference to FIGS. 1b and 1c (i.e. a compound of an element of the second period and an element of the 4d transition group). The thickness of the protective layer 730 is selected so that, firstly, the desired protective action or chemical resistance to contamination occurring during operation of the optical system is achieved and, secondly, the reflectivity in the relevant angle range for grazing incidence is very high, with the thickness of the protective layer 730 being able to be, merely by way of example, 2-3 nm. As material for the substrate 705 it is also possible to use relatively more chemically reactive elements such as molybdenum (Mo) or niobium (Nb) because of the protective action provided by the protective layer 730.

Here, the reflectivity profiles are identical to those examples in which ruthenium (Ru) has been applied as base layer to a substrate composed of any material (cf. FIG. 4B and FIG. 5B).

Even though the invention has been described with the aid of specific embodiments, a person skilled in the art will be able to make use of numerous variations and alternative embodiments, e.g. by combining and/or exchanging features of individual embodiments. Accordingly, such variations and alternative embodiments are encompassed by the present invention and the scope of the invention is restricted only by the accompanying claims and equivalents thereof.

What is claimed is:

1. A mirror, having an optically effective surface and configured to have a reflectivity of at least 0.5 for electromagnetic radiation which has a prescribed working wavelength and impinges on the optically effective surface at an angle of incidence of at least 65° with respect to respective surface normals of the optically effective surface, said mirror comprising:
   a protective layer composed of a protective layer material and arranged as a topmost layer forming the optically effective surface, wherein the protective layer comprises silicon nitride ($Si_3N_4$), or a compound of an element selected from the second period and an element of the 4d transition group,
   wherein the protective layer has a thickness of not more than 5 nm; and
   at least one further layer arranged underneath the protective layer with respect to the optically effective surface and which comprises a compound of an element selected from the second period and an element of the 4d transition group.

2. The mirror according to claim 1, wherein the element of the 4d transition group is selected from the group consisting of molybdenum (Mo), niobium (Nb) and zirconium (Zr).

3. The mirror according to claim 1, wherein the element of the second period is selected from the group consisting of beryllium (Be), boron (B), carbon (C), nitrogen (N) and oxygen (O).

4. The mirror according to claim 1, further comprising at least one barrier layer.

5. The mirror according to claim 1, wherein the working wavelength is less than 30 nm.

6. An optical system of a microlithographic projection exposure apparatus, comprising at least one mirror according to claim 1.

7. A microlithographic projection exposure apparatus comprising an illumination device and a projection lens,
   wherein the illumination device illuminates a mask present in an object plane of the projection lens during operation of the projection exposure apparatus and the projection lens projects structures on the mask onto a light-sensitive layer arranged in an image plane of the projection lens, and
   wherein the projection exposure apparatus comprises at least one mirror according to claim 1.

8. The mirror according to claim 1, wherein the further layer is configured to at least partly compensate a decrease in reflectivity brought about by the protective layer.

9. A mirror, having an optically effective surface and configured to have a reflectivity of at least 0.5 for electromagnetic radiation which has a prescribed working wavelength and impinges on the optically effective surface at an angle of incidence of at least 65° with respect to respective surface normals of the optically effective surface, said mirror consisting essentially of:
   a layer which comprises a compound of an element selected from the second period and an element selected from the 4d transition group; and
   no more than a single further layer, the further layer forming a substrate.

10. The mirror according to claim 9, wherein the element of the 4d transition group is selected from the group consisting of molybdenum (Mo), niobium (Nb) and zirconium (Zr).

11. The mirror according to claim 9, wherein the element of the second period is selected from the group consisting of beryllium (Be), boron (B), carbon (C), nitrogen (N) and oxygen (O).

* * * * *